United States Patent [19]
Otis et al.

[11] Patent Number: 5,497,288
[45] Date of Patent: Mar. 5, 1996

[54] APPARATUS FOR TILTED SERIAL COOLING IN AN ELECTRONIC SYSTEM

[75] Inventors: Bruce P. Otis; Russell E. Dickson, both of Rochester, Minn.

[73] Assignee: International Business Machines Corporation, Armonk, N.Y.

[21] Appl. No.: 298,986

[22] Filed: Aug. 31, 1994

[51] Int. Cl.⁶ ..................................................... H05K 7/20
[52] U.S. Cl. ........................ 361/687; 165/80.3; 361/695; 454/184
[58] Field of Search .................................. 165/122, 126, 165/80.3; 454/184; 174/16.1; 257/712, 713, 721, 723, 724; 361/685, 687, 690–695, 718–720, 724, 725, 727, 735, 744, 790

[56] References Cited

U.S. PATENT DOCUMENTS

| | | | |
|---|---|---|---|
| 3,316,457 | 4/1967 | Klos | 317/100 |
| 3,462,553 | 8/1969 | Spranger | 179/1 |
| 4,479,198 | 10/1984 | Romano | 364/900 |
| 4,702,154 | 10/1987 | Dodson | 98/1 |
| 5,063,475 | 11/1991 | Balan | 361/384 |
| 5,107,398 | 4/1992 | Bailey | 361/384 |
| 5,163,870 | 11/1992 | Cooper | 454/184 |
| 5,210,680 | 5/1993 | Scheibler | 361/384 |
| 5,355,278 | 10/1994 | Hosoi | 361/800 |

FOREIGN PATENT DOCUMENTS

| | | | |
|---|---|---|---|
| 2266599 | 10/1990 | Japan | H05K 7/20 |
| 4259291 | 9/1992 | Japan | 361/695 |

OTHER PUBLICATIONS

Schroff, Inc., "The bus Special", Spring 1994. pp. 1–6.

Primary Examiner—Gerald P. Tolin
Attorney, Agent, or Firm—Owen J. Gamon

[57] ABSTRACT

An apparatus that provides a cooling system in which electronic components are serially configured in the air flow path and tilted down to form a "V" formation when viewed from the side. An air moving device draws air from an inlet, serially past first and second components and exhausts air through an outlet. This formation increases the inlet air opening, increases the area to turn the air in between the components, and increases the size of the plenum between the rear components and the air moving device, all without increasing the size of the electronic device. The larger area reduces the resistance of the air flow cooling path by reducing the number of turns and velocity changes of the air flow, which allows the air moving device to be smaller, use less power, and generate less noise.

16 Claims, 5 Drawing Sheets

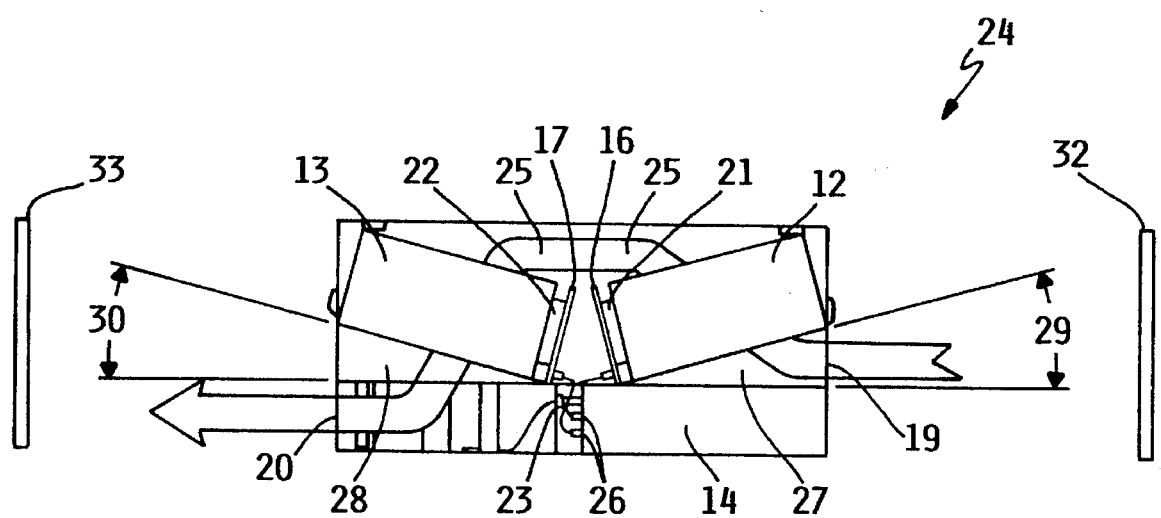
FIG. IB

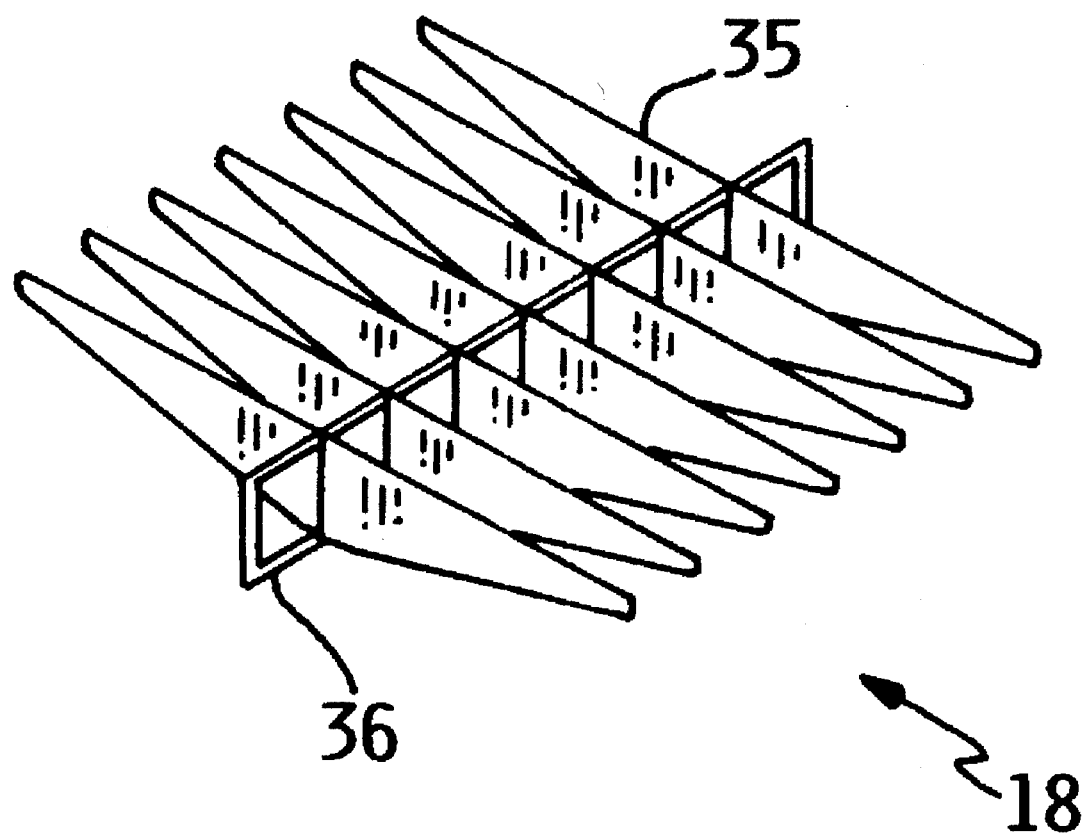
FIG. IC

APPARATUS FOR TILTED SERIAL COOLING IN AN ELECTRONIC SYSTEM

FIELD OF THE INVENTION

This invention relates to a cooling system for electronic components.

BACKGROUND OF THE INVENTION

The operation of electronic devices, such as computers, disk drives, television sets, and VCRs, is controlled by electrical circuits. These electrical circuits are packaged together into electronic components, which typically perform a function or a set of functions. The electronic components are typically mounted in an enclosed cabinet. The cabinet provides structural support as well as protection from the exterior environment. Electronic components are frequently modular and may need to be removed for maintenance, repair, replacement, or performance upgrading. To provide access to these electronic components, it is common to see the enclosed cabinet featuring access doors or removable panels. Due to limited office space or real estate, it is not uncommon to see electronic devices placed side by side and on top of one another. In such a dense and compact environment, it is very important to have front and rear access to the internal electronic components.

As electricity flows through the electronic components, heat is generated. Excessive heat can be very detrimental to the function and reliability of these electronic components. In general, cool electronic components operate more consistently and last longer, so it is important that the heat be removed so that it does not impact the performance of the electronic components or the performance of the surrounding equipment.

Heat can be removed by conduction, convection, or radiation. One of the most cost effective methods for cooling electronic components is a form of convection cooling called forced air convection. Heat removed by this method is pushed or pulled off the electronic component with moving air. The air is brought into the electronic device with a fan or blower and is directed over the electronic components. As the air passes over these components, the temperature of the air increases. This warm air is eventually expelled from the device. Ideally, this warm air is exhausted from the side opposite of the inlet to reduce the likelihood of exhaust recirculation. Exhaust recirculation is very detrimental to the cooling of the device as well as neighboring devices because the temperature of the electronic components increases linearly with the increase in inlet air temperature. Since other heat producing electronic equipment frequently surrounds the electronic device, it is beneficial that the cooling air inlet be in the front and the exhaust be in the rear of the device. Doing so also provides another advantage: the warm exhaust air doesn't blow on the individuals using the equipment. The benefits of front to back cooling is well recognized as most electronic equipment features front inlets and rear exhaust.

The amount of cooling air that travels through the electronic device is controlled by the fan or blower, which pushes or pulls the air via a multitude of rotating propellers or blades. In doing so, some acoustic noise is generated. The intensity of the noise depends on how hard the fans or blowers must work, which depends upon the amount of cooling air that is being moved and the air flow resistance of the cooling system. The amount of cooling air depends on how much heat needs to be removed from the electronic components. The air flow resistance depends on how easily air travels through the system. If the air flow path is relatively unobstructed, this resistance is small. If the air flow path is curvaceous, narrow, or filled with obstructions, the resistance can be very high.

The current trend in electronic design is towards smaller and more powerful devices. Cooling these compact devices is becoming increasingly difficult as higher power components are being placed closer to one another. To achieve proper cooling, fans and blowers must work harder. The end result may be a design that produces excessive and unacceptable acoustic noise.

Consequently, designs that reduce the amount of cooling air that is required or reduce the air flow resistance of the system are valuable and are sought after. In general, there are two design strategies to accomplish this: serial cooling and parallel cooling. Serial cooling has one inlet, one cooling path, and one exit. Parallel cooling typically has multiple inlets, multiple paths, and one or more exits.

The key advantage of a parallel cooled system is the relatively short cooling paths. These shorter lengths normally result in a lower air flow resistance which, taken alone, could allow implementation of a smaller and quieter fan or blower. Unfortunately this positive attribute can be offset by the relative high cooling flow rates inherent in a parallel cooled system. A parallel cooled system provides fresh (non-preheated) air for each electronic component. Since each path is separate, the total air flow for the system is the sum of each of the paths. If, for example, the electronic device is comprised of two arrays of disk drives in parallel that require 40 cubic feet per minute (cfm) each, the total cooling flow rate would be:

$$40 \text{ cfm} + 40 \text{ cfm} = 80 \text{ cfm}.$$

Despite the benefits of shorter cooling paths, a parallel cooled system's high cooling flow rate can demand, overall, larger fans or blowers. Consequently, a parallel cooled system may yield poor acoustic performance.

The key advantage of a serial cooled system is that the overall amount of cooling air is less than that for a parallel system. In a serial cooled system, the cooling air temperature becomes warmer as it travels through the system's air flow path. Consequently, the last electronic component in the air flow path will be warmer than the first electronic component in the air flow path. To counter this, serial cooled systems operate with a higher air flow per electronic component. For example, if the electronics were the same disk drives as described above, the front disk drives still require 40 cfm of cooling air. To compensate for the preheated air, the rear disk drives would require more air flow, perhaps 50 cfm. Since the air flow paths are common, the system would need to operate at 50 cubic feet per minute for adequately cooling. This is 30 cfm less than that required for the parallel cooled system. With this aspect taken alone, a serial cooled system could use a smaller and quieter fan or blower. Unfortunately this positive attribute can be offset by the relative long cooling path of a serial cooled system. The longer path normally results in a larger air flow resistance, which is detrimental to the acoustic performance of the device.

For the foregoing reasons, there is a need for a cooling system for an electronic device that allows for front to back access, front to back cooling, a small size, and quiet operation.

SUMMARY OF THE INVENTION

It is an object of the present invention to provide an enhanced cooling system that reduces the air flow resistance for an electronic device.

It is an object of this invention to provide an enhanced cooling system that reduces the cabinet height.

It is yet another object of this invention to provide an enhanced cooling system that reduces the noise produced by the system.

It is still another object of this invention to provide an enhanced cooling system with reduced noise, reduced cabinet height, and front to back cooling.

It is still another object of this invention to provide an enhanced cooling system with reduced noise, reduced cabinet height, and front to back access.

These and other objects are achieved by a cooling system in which electronic components are serially configured in the air flow path and tilted down to form a "V" formation when viewed from the side. An air moving device draws air from an inlet, serially past first and second components and exhausts air through an outlet. This formation increases the inlet air opening, increases the area to turn the air in between the components, and increases the size of the plenum between the rear components and the air moving device, all without increasing the size of the electronic device. The larger area reduces the resistance of the air flow cooling path by reducing the number of turns and velocity changes of the air flow, which allows the air moving device to be smaller, use less power, and generate less noise.

BRIEF DESCRIPTION OF THE DRAWINGS

FIG. 1a, 1b, and 1c show an overall isometric view, a cross sectional schematic, and a detailed isometric view, respectively, of an example of a serial cooled electronic device constructed in accordance with the principles of the present invention;

DETAILED DESCRIPTION OF PREFERRED EMBODIMENT

Figure 1A:
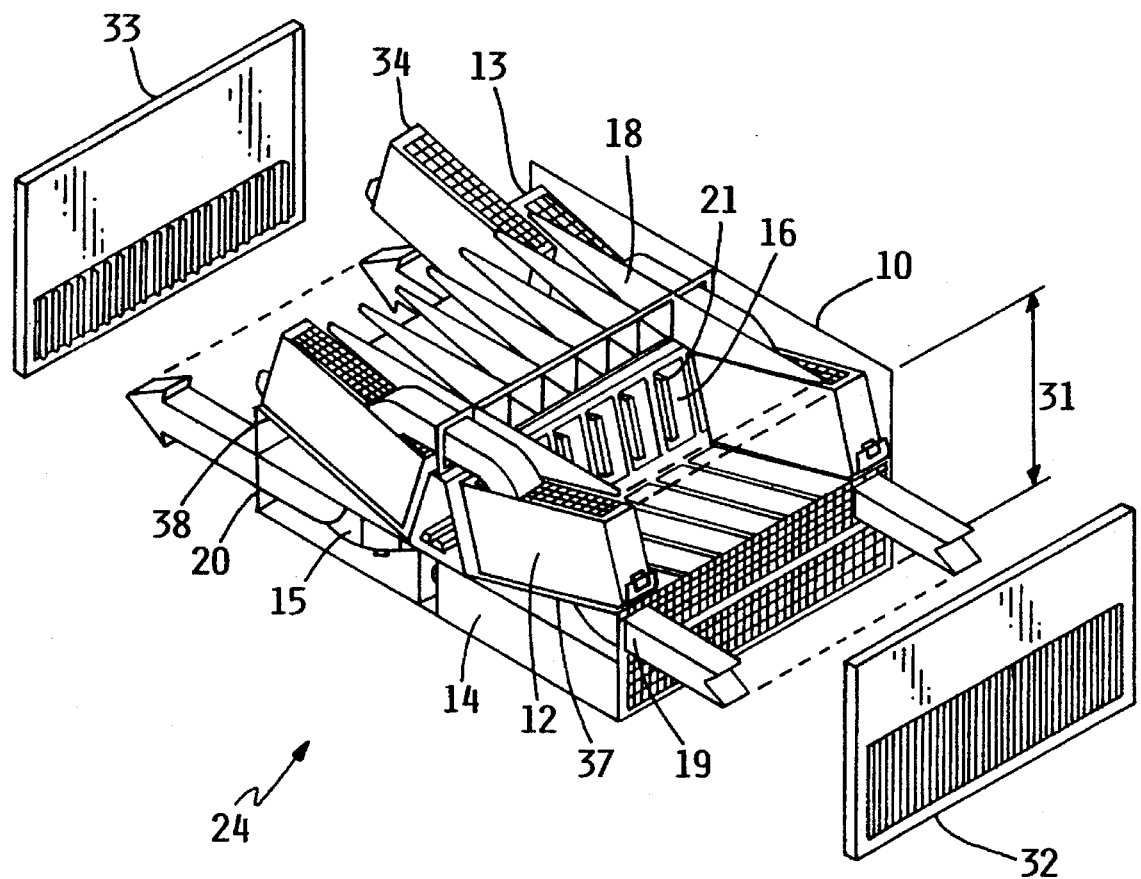

FIGS. 1a, 1b, and 1c respectively show an overall isometric view, a cross sectional view and a detailed isometric view of serial cooled electronic device 24. For purposes of clarity, the top and left side are not shown, and front cover 32 and rear cover 33 are shown detached. As described herein, device 24 is constructed in accordance with the principles of the present invention. The device is made up of enclosed cabinet 10 that provides the physical support and orientation for the various internal sub-assemblies. The primary sub-assemblies are as follows. At the front of device 24, are a plurality of electronic components 12 that are interconnected by longitudinal backplane (or circuit board) 16 via a plurality of auto docking connectors 21. Below these front electronic components 12 are support electronics 14. Support electronics 14 provide, among other things, conditioned power, control signals, and any auxiliary equipment to support the function of the electronic device or other external electronic devices.

Air Moving Device (AMD) 15, a centrifugal blower in this example, is disposed behind support electronics 14. The air moving device could also be a screw impeller fan. A screw impeller fan has the air inlet and outlet parallel to the axis of rotation of the spinning fan blades. A centrifugal blower has only the inlet parallel to the rotating blades with the outlet being perpendicular or radial to the spinning blades. AMD 15 is a typical centrifugal blower that is oriented, in this example, with its axis vertical. AMD 15 receives power and control signals from support electronics 14 via connector 23, which autodocks with support electronics 14.

Above AMD 15 are a plurality of rear electronic components 13 that are interconnected by longitudinal backplane (or circuit board) 17 via a plurality of connectors 22. Although the preferred embodiment has a plurality of rear electronic components, there could be just one rear electronic component. Electronic components 12 and 13 receive internal power and control signals via a plurality of cables 26 that electronically connect longitudinal circuit boards 16 and 17 to support electronics 14.

Cooling air enters into enclosure cabinet 10 via front cover 32 and air inlet 19. The cooling air travels into front air plenum 27 and up through the plurality of front electronic components 12. The air, now at an elevated temperature, travels across middle air plenum 25 and down through the plurality of rear electronic components 13 and down through rear plenum 28. The air, now at a greater elevated temperature, is exhausted through rear exhaust air outlet 20 and rear cover 33 via AMD 15. In general, the cooling air travels front to back with no additional air inlets or outlets on the bottom, top or sides of enclosure cabinet 10. This permits electronic device 24 to be installed into an equipment rack and allows additional equipment or objects to be placed adjacent to the sides, on the bottom or the top without impacting the cooling of the system (illustrated in FIG. 3).

In the center of middle air plenum 25 is optional pressure balance assembly 18 shown in detail in FIG. 1c. Pressure balance assembly 18 is made up of a plurality of air vanes 35 and pressure balance plate 36. Air vanes 35 maintain separation of the plurality of cooling subpaths. This may be important if one of the cooling paths has considerably less air resistance than the others. Without air vanes 35, in this instance, the cooling air would not travel front to back in middle plenum 25 but would head for the path of least resistance. The consequence could be inadequate cooling of some of rear electronic components 13. Pressure balance plate 36 throttles the air flow in the plurality of cooling subpaths by adding a plurality of restrictions. In this example, these restrictions take the form of rectangular holes. The size of each hole is adjusted to obtain proper air flow through each individual path. If, for example, one of the electronic components 12 requires much more air flow than the remaining components, pressure balance plate 36 would be free of restrictions on that particular cooling path while the remaining paths would have a sufficient restriction added to ensure proper air flow distribution between all the electronic components.

Enclosure cabinet 10 contains front support structure 37, which supports and orients the plurality of front electronic modules 12 such that they form angle 29 relative to the top surface of support electronics 14. Enclosure cabinet 10 also contains rear support structure 38, which supports and orients the plurality of rear electronic modules 13 such that they form an angle 30 relative to the top surface of support electronics 14. Likewise the two longitudinal circuit boards 16 and 17 and their corresponding plurality of connectors are at angles 29 and 30, respectively, from vertical. Tilting the plurality of electronic components 12 and 13 by angles 29 and 30 improves the cooling efficiency and, consequently, allows for an overall smaller package. Angles 29 and 30 should be greater than 0 and less than 90 degrees. In a preferred embodiment, both angles 29 and 30 are 13.5 degrees.

In general, the most efficient cooling system delivers cooling air directly to the heat source. Each turn or change in velocity of the air in the air flow path reduces the efficiency of the design. Unfortunately, delivering cooling air directly to the heat source may not always be possible or practical because, due to packaging space limitations, components might have to be oriented such that the cooling air has to turn to reach the components. Since turning the cooling air increases the pressure drop of the system and taxes the air moving device, turns should be minimized. Every time the cooling air has to change direction (turn) or change speed (travel through an area with a changing cross-sectional area), energy is lost. This loss of energy is termed a pressure drop. In order to maintain airflow, the AMD must overcome the summation of all the pressure drops encountered in the cooling system. Large system pressure drops, therefore, require large AMDs, which, in general, cost more, draw larger amounts of power, and create significantly more acoustic noise. Tilting the plurality of components 12 and 13 into a "V" formation reduces the pressure drop of the system. Consequently, the overall package height 31 may be reduced or a smaller and quieter blower may be selected.

Tilting the electronic components into a "V" formation reduces the turns of the cooling air as well as increases the cross sectional area in front and behind each electronic component. Increasing this area is important as the velocity of the air is reduced in the area of the turn. The volumetric flow rate (say 50 cfm) can be thought of as a planar area traveling at a specific velocity (cfm= velocity×area). If volumetric flow is constant, then decreasing the area increases the velocity. Increasing the velocity can be very detrimental as more energy can be lost when the air hits obstructions or walls. This lost energy has to be put back into the air via the air moving device. Consequently, more power has to be pumped into the air moving device. This power increases the acoustic noise level.

Figure 2:
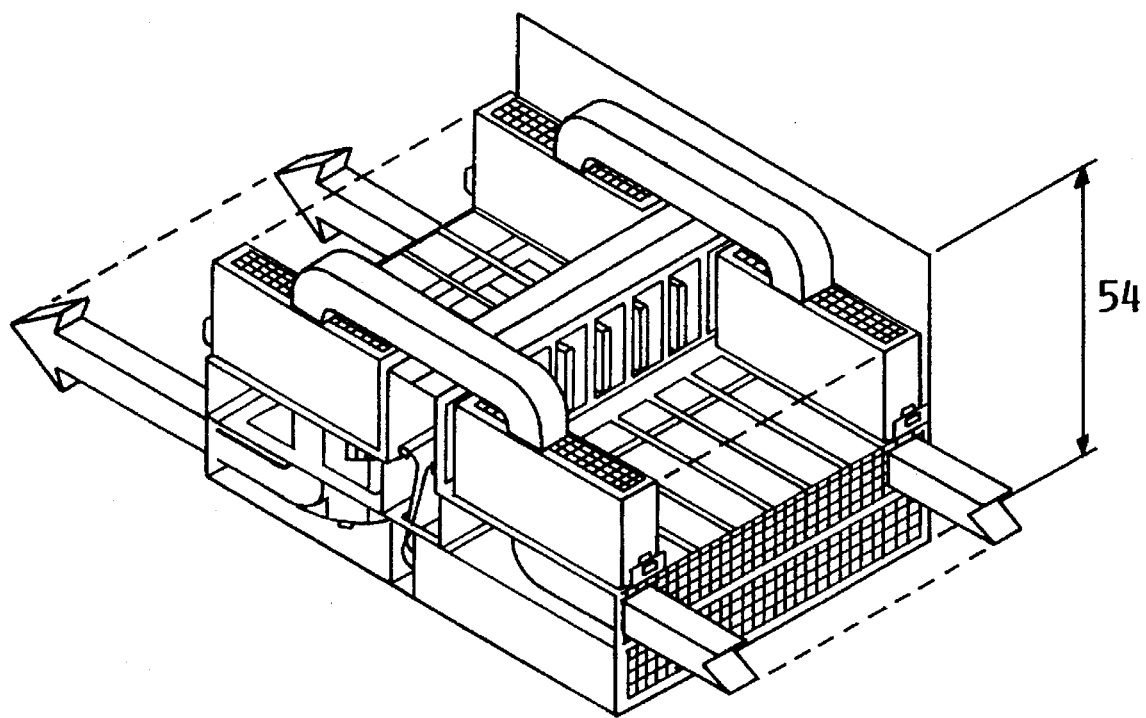
FIG. 2 shows an overall isometric view of a serial cooled electronic device with electronic components placed horizontally.

FIG. 2 illustrates a typical design with front and rear access to electronic devices where the devices are oriented parallel to the horizontal axis with no tilt. This design suffers from the several disadvantages. Height 54 is much larger than the preferred embodiment height 31. Also, the turns of the cooling air are large, which causes a large pressure drop, requiring a large fan or blower, which increases the acoustic noise level.

As shown in FIG. 1b, the cooling air turns are less excessive than the turns of FIG. 2. Consequently, a lower pressure drop is realized. This lower pressure drop can be capitalized to improve the design as follows. If the original pressure drop of the system and the acoustic performance was acceptable, the overall height could now be reduced. Alternately, if the current height was acceptable, a smaller and quieter AMD could now be selected.

Front to back maintenance is possible for the plurality of components 12 and 13 as well as AMD 15. This feature allows either of the fore mentioned sub-assemblies to be removed with out effecting the remaining sub-assemblies. As shown in FIG. 1a, maintenance is performed by removing front cover 32 and rear cover 33. The electronic components can be removed from the front or the rear as illustrated by electronic component 34. This feature is essential if maintenance of the system is to be performed without affecting the operation of the remaining components or system.

Tilting the plurality of components 12 and 13 into a "V" formation reduces the length of cables 26 that allow communications between the plurality of components 12 and 13 and support electronics 14. Reducing cable lengths may be essential for high speed electrical function.

Tilting the plurality of components 12 and 13 into a "V" formation aids in the installation and removal of the components. For example, maintainers don't have to impart all of the insertion and extraction force in the horizontal direction. This can be beneficial if device 24 is not entirely secured in the horizontal direction.

Tilting the plurality of components 12 and 13 into a "V" formation improves the visibility of the components. This can be beneficial if indicator lights on the components are somewhat directional.

Figure 3:
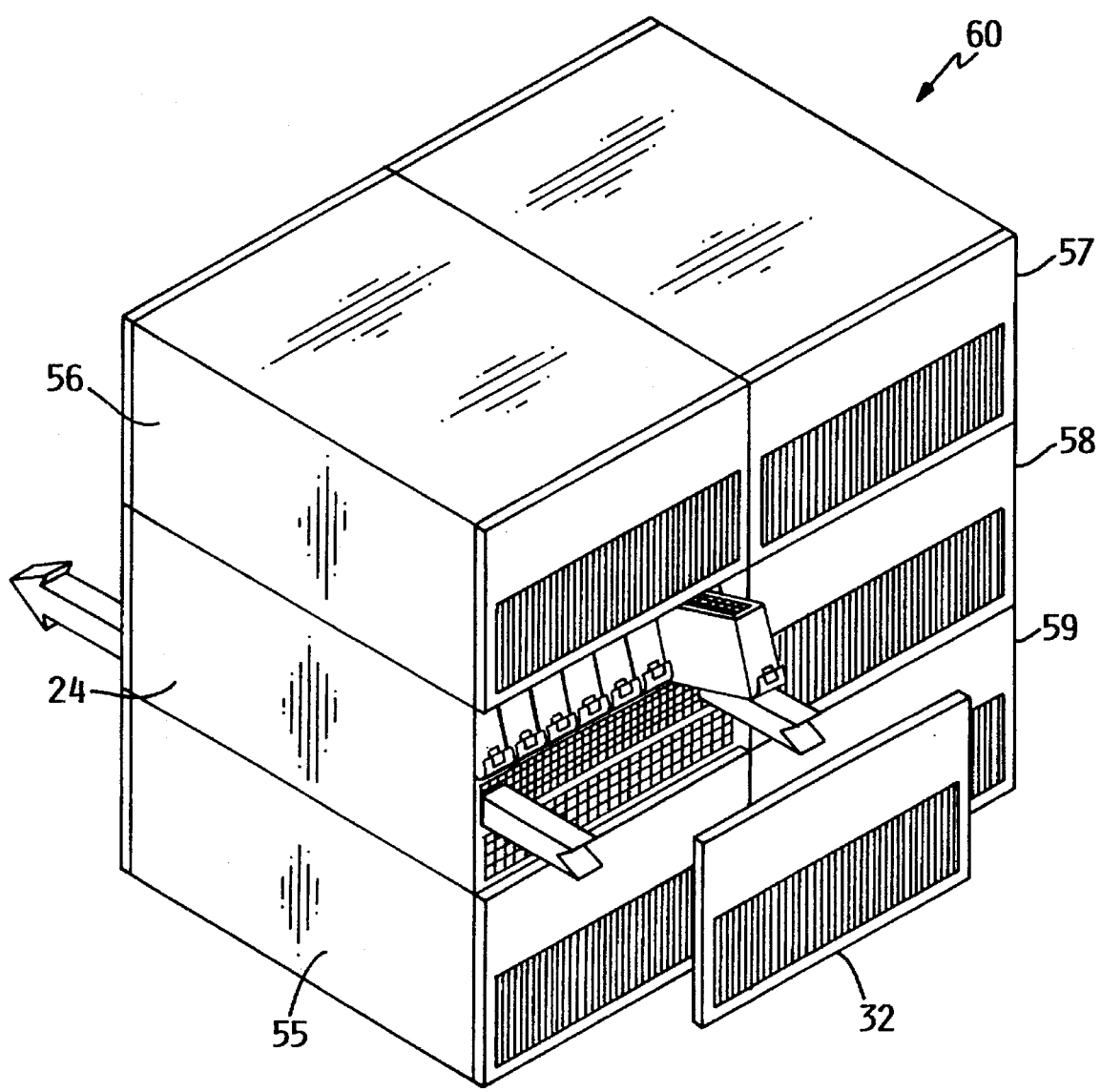
FIG. 3 shows an example of a serial cooled electronic device mounted in a rack of a computer system.

FIG. 3 shows electronic device 24 mounted in a rack of computer system 60, which is preferably an International Business Machines Corporation AS/400 computer system. In this example, computer system 60 is made up of interconnected electronic devices 24, 55, and 56 in one rack and electronic devices 57, 58, and 59 in another rack. The two racks of electronic devices could also be two different computer systems that are situated in close proximity. Electronic device 24 is surrounded by electronic device 58 to the right, electronic device 56 above, and electronic device 55 below. The configuration of electronic devices in racks could extend indefinitely, horizontally, and vertically. Front to back cooling allows device 24 to be installed in a rack, cabinet or placed in close proximity with other objects on the top, bottom or sides. Front to back cooling also reduces the possibility of recirculating the warm exhaust air into the fresh air inlet, which is detrimental to the cooling of a system.

While this invention has been described with respect to the preferred and alternative embodiments, it will be understood by those skilled in the art that various changes in detail may be made therein without departing from the spirit, scope, and teaching of the invention. For example, the air moving device could be in a variety of locations, including near the air inlet, near the air outlet, and between the electronic components. The electronic components could be a variety of shapes and sizes and do not need to be all the same size. Accordingly, the herein disclosed invention is to be limited only as specified in the following claims.

What is claimed is:

1. An electronic device, comprising:

a cabinet having an air inlet, an air outlet, and an air flow path from said air inlet to said air outlet;

a first electronic component assembly having an end closest to said air inlet and an end furthest from said air inlet, said first electronic component assembly being mounted in said air flow path of said cabinet so that said furthest end of said first electronic component assembly is tilted downward, with respect to said closest end of said first electronic component assembly, at an angle of greater than 0 and less than 90 degrees from the horizontal axis of said cabinet;

a second electronic component assembly having an end closest to said air inlet and an end furthest from said air inlet, said second electronic component assembly being mounted serially in said air flow path with respect to said first electronic component assembly so that said closest end of said second electronic component assembly is tilted downward, with respect to said furthest end of said second electronic component assembly, at an angle of between 0 and 90 degrees from the horizontal axis of said cabinet;

means for air pressure balancing disposed in said air flow path above said first electronic component assembly and said second electronic component assembly; and means for moving air through said air inlet, serially past said first and second electronic component assemblies, and exhausting said air out of said air outlet.

2. The electronic device of claim 1, wherein said first electronic component assembly further comprises a plurality of disk drives mounted in parallel in said cooling path and said second electronic component assembly further comprises a plurality of disk drives mounted in parallel in said cooling path.

3. The electronic device of claim 1, wherein said air inlet is at the front of said cabinet and said air outlet is at the rear of said cabinet.

4. The electronic device of claim 3, wherein said cabinet further comprises a front access panel.

5. The electronic device of claim 3, wherein said cabinet further comprises a rear access panel.

6. The electronic device of claim 1, wherein said means for air pressure balancing further comprises:

a pressure balance plate disposed above and between said first electronic component assembly and said second electronic component assembly; and a plurality of air vanes for maintaining separation of said cooling path into a plurality of subpaths.

7. A computer system composed of a plurality of interconnected electronic devices stacked vertically, comprising:

a first electronic device;

a second electronic device, stacked above said first electronic device, said second electronic device, comprising:

a cabinet having an air inlet, an air outlet, and an air flow path from said air inlet to said air outlet, a first electronic component assembly having an end closest to said air inlet and an end furthest from said air inlet, said first electronic component assembly being mounted in said air flow path of said cabinet so that said furthest end of said first electronic component assembly is tilted downward, with respect to said closest end of said first electronic component assembly, at an angle of between 0 and 90 degrees from the horizontal axis of said cabinet, a second electronic component assembly having an end closest to said air inlet and an end furthest from said air inlet, said second electronic component assembly being mounted serially in said air flow path with respect to said first electronic component assembly so that said closest end of said second electronic assembly is tilted downwards with respect to said furthest end of said second electronic component assembly, at an angle of greater than 0 and less than 90 degrees from the horizontal axis of said cabinet, means for air pressure balancing disposed in said air flow path above said first electronic component assembly and said second electronic component assembly, and means for moving air through said air inlet, serially past said first and second electronic components, and exhausting said air out of said air outlet; and a third electronic device, stacked above said second electronic device.

8. The computer system of claim 7, wherein said first electronic component assembly is a plurality of disk drives mounted in parallel in said cooling path and said second electronic component assembly is a plurality of disk drives mounted in parallel in said cooling path.

9. The computer system of claim 7, wherein said air inlet is at the front of said cabinet and said air outlet is at the rear of said cabinet.

10. The computer system of claim 9, wherein said cabinet further comprises a front access panel.

11. The computer system of claim 9, wherein said cabinet further comprises a rear access panel.

12. The computer system of claim 7, wherein said means for air pressure balancing further comprises:

a pressure balance plate disposed above and between said first electronic component assembly and said second electronic component assembly; and a plurality of air vanes for maintaining separation of said cooling path into a plurality of subpaths.

13. An apparatus for housing a plurality of electronic components, comprising:

a cabinet;

a front panel having an air inlet, wherein said front panel is attached to said cabinet;

a rear panel having an air outlet, wherein said rear panel is attached to said cabinet, and wherein said cabinet, said air inlet, and said air outlet form an air flow path;

a front support structure for a plurality of front electronic components, said front support structure having an end closest to said air inlet and an end furthest from said air inlet, said front support structure being mounted in said air flow path of said cabinet so that said furthest end of said front support structure is tilted downward, with respect to said closest end of said front support structure, at an angle of greater than 0 and less than 90 degrees from the horizontal axis of said cabinet;

a rear support structure for a plurality of rear electronic components, said rear support structure having an end closest to said air inlet and an end furthest from said air inlet, said rear support structure being mounted serially, with respect to said front support structure, in said air flow path of said cabinet so that said closest end of said rear support structure is tilted downward, with respect to said furthest end of said rear support structure, at an angle of between 0 and 90 degrees from the horizontal axis of said cabinet; and air pressure balancing means for balancing air pressure between said plurality of front and rear electronic components, wherein said air pressure balancing means is disposed in said air flow path above said front support structure and said rear support structure.

14. The apparatus of claim 13, further comprising:

means for moving air through said air inlet, serially past said front and rear support structures, and exhausting said air out of said air outlet.

15. The apparatus of claim 13, further comprising:

a front backplane attached to said front support structure; and a rear backplane attached to said rear support structure.

16. The apparatus of claim 13, wherein said air pressure balancing means further comprises:

a pressure balance plate disposed above and between said front support structure and said rear support structure; and a plurality of air vanes attached to said pressure balance plate.

* * * * *